(12) United States Patent
Tetelbaum et al.

(10) Patent No.: US 7,174,524 B2
(45) Date of Patent: Feb. 6, 2007

(54) METHOD OF FLOORPLANNING AND CELL PLACEMENT FOR INTEGRATED CIRCUIT CHIP ARCHITECTURE WITH INTERNAL I/O RING

(75) Inventors: Alexander Tetelbaum, Hayward, CA (US); Benjamin Mbouombouo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 221 days.

(21) Appl. No.: 10/947,618

(22) Filed: Sep. 22, 2004

(65) Prior Publication Data
US 2006/0064662 A1  Mar. 23, 2006

(51) Int. Cl.
*G06F 17/50* (2006.01)

(52) U.S. Cl. .......................................................... 716/8

(58) Field of Classification Search ..................... 716/8
See application file for complete search history.

(56) References Cited

U.S. PATENT DOCUMENTS

| | | | | |
|---|---|---|---|---|
| 6,057,109 A | * | 5/2000 | Tartaglia | 435/6 |
| 6,457,157 B1 | * | 9/2002 | Singh et al. | 716/2 |
| 6,823,501 B1 | * | 11/2004 | Dahl | 716/9 |
| 6,829,754 B1 | * | 12/2004 | Yu et al. | 716/5 |
| 2006/0064660 A1 | * | 3/2006 | Chung-Maloney et al. | 716/8 |

\* cited by examiner

Primary Examiner—Stacy A Whitmore
(74) Attorney, Agent, or Firm—Eric J. Whitesell

(57) ABSTRACT

A method and computer program are disclosed for floorplanning and cell placement of an integrated circuit architecture that include steps of: (a) receiving as input a design for an integrated circuit architecture that includes a plurality of modules and an internal I/O ring; (b) creating a floorplan to define an area for placing module cells for each module in the plurality of modules wherein for each module that overlaps the internal I/O ring, an area of intersection between the area defined for placing the module cells and an area bounded by a side of the internal I/O ring for which the area of intersection is least is a global minimum for the plurality of modules; and (c) generating as output the floorplan for the integrated circuit architecture.

14 Claims, 8 Drawing Sheets

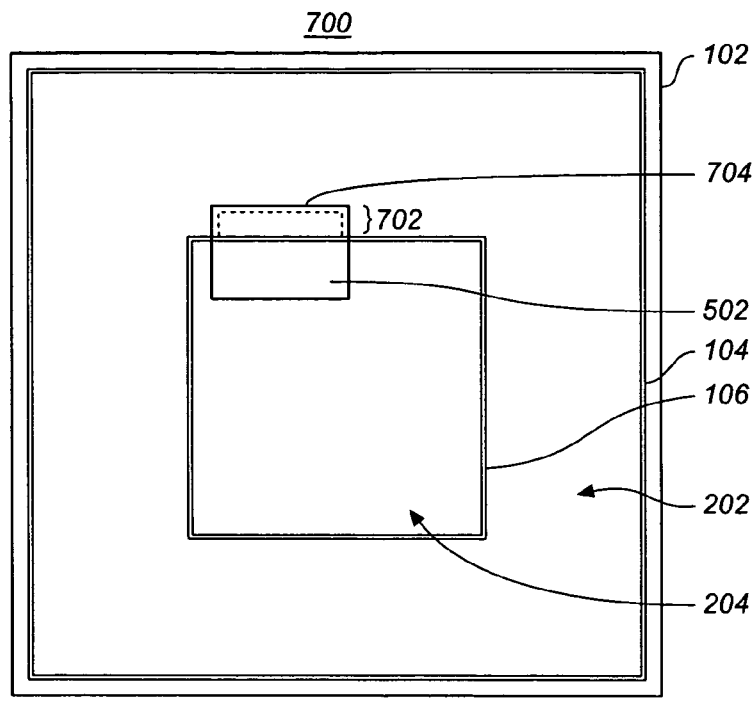
FIG._7
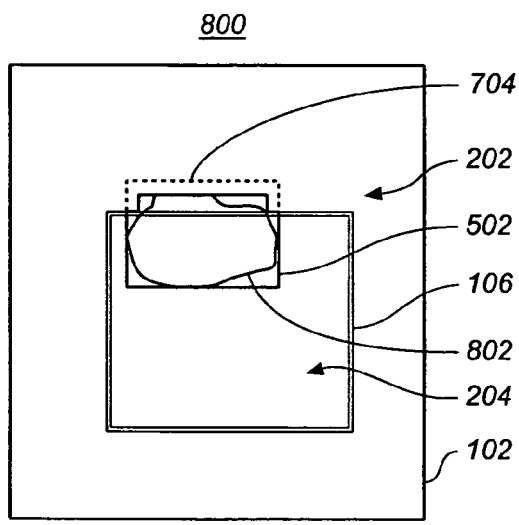
FIG._8
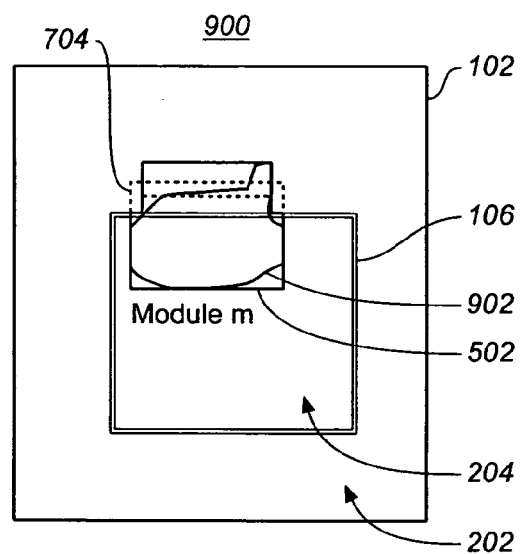
FIG._9

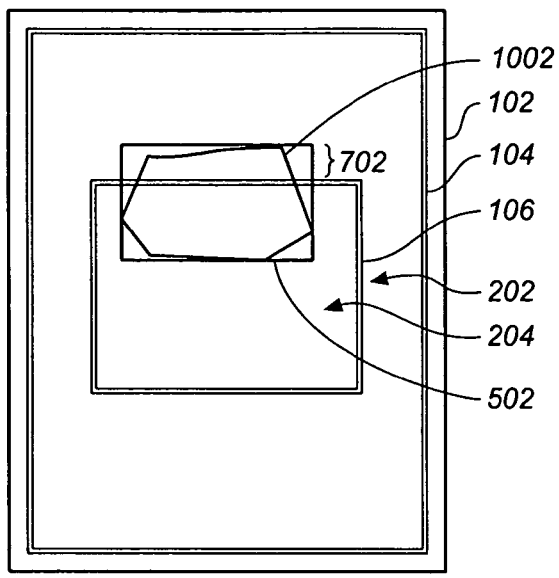
FIG._10
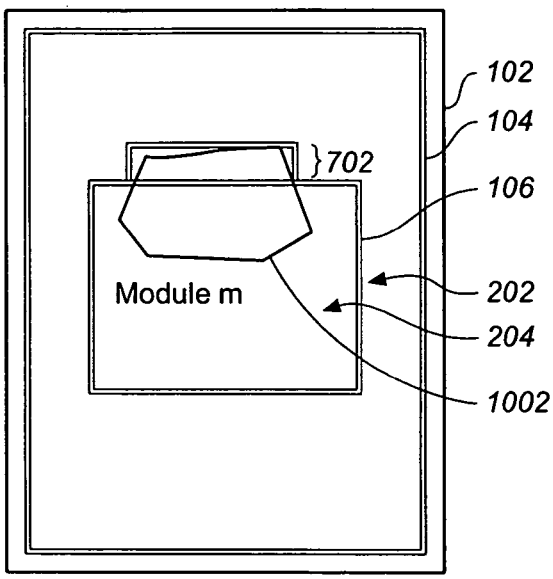
FIG._11
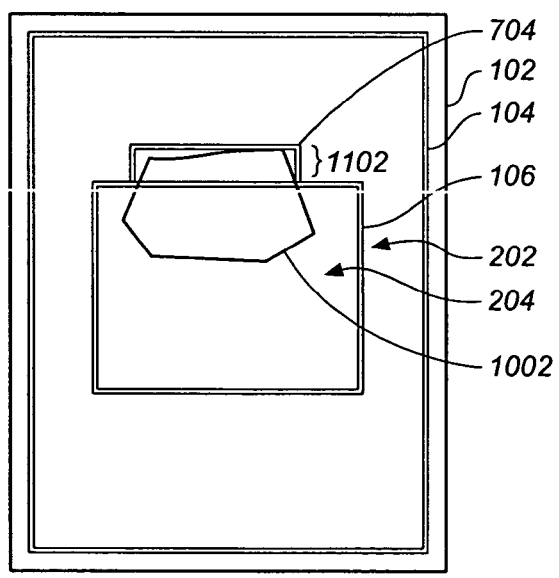
FIG._12
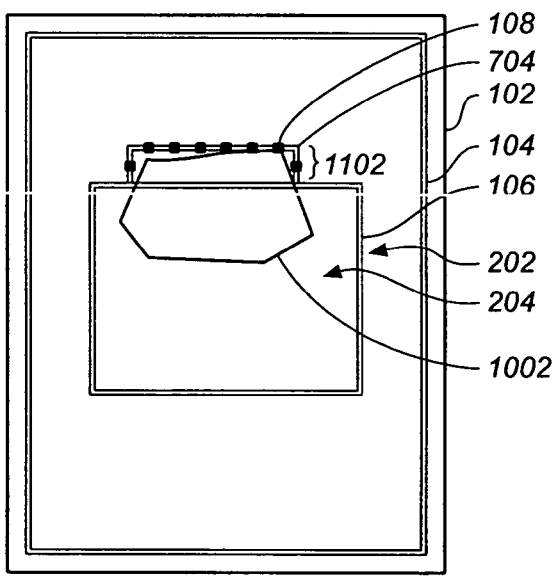
FIG._13

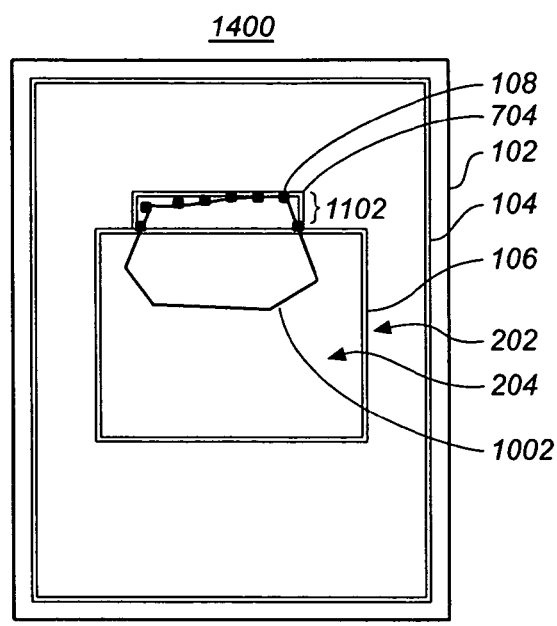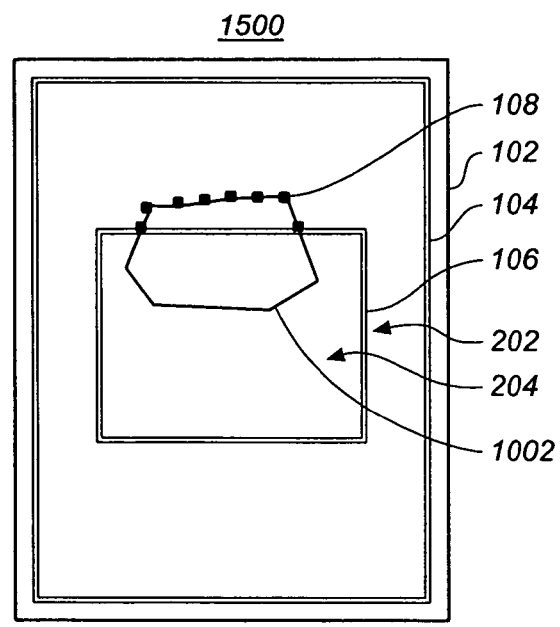
*FIG._14*  *FIG._15*

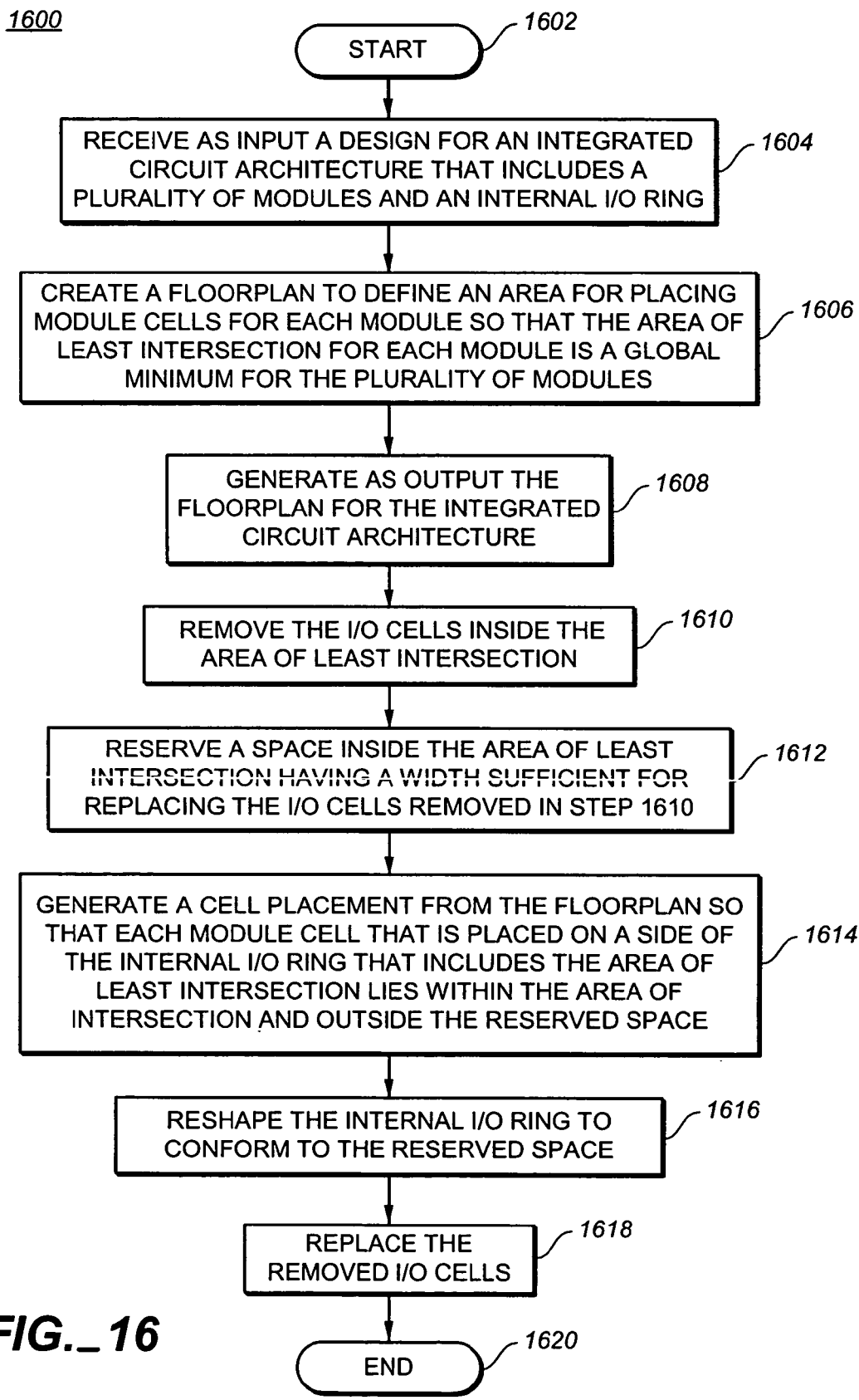
FIG._16

METHOD OF FLOORPLANNING AND CELL PLACEMENT FOR INTEGRATED CIRCUIT CHIP ARCHITECTURE WITH INTERNAL I/O RING

BACKGROUND OF THE INVENTION

1. Field of the Invention

The present invention is directed to the design of application specific integrated circuits (ASICs). More specifically, but without limitation thereto, the present invention is directed to floorplanning and cell placement of an ASIC design.

2. Description of the Prior Art

In a typical chip architecture used for application specific integrated circuits, I/O cells are placed in an external I/O ring and in an internal I/O ring that surround the core area of the chip. The internal I/O ring lies approximately half way between the die solder bumps and the outer edge of the chip. During floorplanning and cell placement, some modules overlap the internal I/O ring.

SUMMARY OF THE INVENTION

In one aspect of the present invention, a method includes steps of:
(a) receiving as input a design for an integrated circuit architecture that includes a plurality of modules and an internal I/O ring;
(b) creating a floorplan to define an area for placing module cells for each module in the plurality of modules wherein for each module that overlaps the internal I/O ring, an area of intersection between the area defined for placing the module cells and an area bounded by a side of the internal I/O ring for which the area of intersection is least is a global minimum for the plurality of modules; and
(c) generating as output the floorplan for the integrated circuit architecture.

In another aspect of the present invention, a computer program product includes:
a medium for embodying a computer program for input to a computer; and
a computer program embodied in the medium for causing the computer to perform steps of:
(a) receiving as input a design for an integrated circuit architecture that includes a plurality of modules and an internal I/O ring;
(b) creating a floorplan to define an area for placing module cells for each module in the plurality of modules wherein for each module that overlaps the internal I/O ring, an area of intersection between the area defined for placing the module cells and an area bounded by a side of the internal I/O ring for which the area of intersection is least is a global minimum for the plurality of modules; and
(c) generating as output the floorplan for the integrated circuit architecture.

DESCRIPTION OF THE DRAWINGS

The present invention is illustrated by way of example and not limitation in the accompanying figures, in which like references indicate similar elements throughout the several views of the drawings, and in which:

FIG. 7 illustrates a diagram for a method according to an embodiment of the present invention of generating a floorplan that reserves a space in a module that overlaps the internal I/O ring for replacing the I/O cells removed in FIG. 6;

FIG. 8 illustrates a diagram of an example of a valid cell placement from the floorplan of FIG. 7;

FIG. 9 illustrates a diagram of an example of a invalid cell placement from the floorplan of FIG. 7;

FIGS. 10 and 11 illustrate diagrams for a method according to an embodiment of the present invention of reshaping the internal I/O ring;

FIGS. 12 and 13 illustrate diagrams for a method according to an embodiment of the present invention of restoring the I/O cells removed in FIG. 6;

FIGS. 14 and 15 illustrate a diagram for restoring the I/O cells removed in FIG. 6 along the boundary of the module cells; and FIG. 16 illustrates a flow chart of a method according to an embodiment of the present invention for floorplanning and cell placement.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

Figure 1:
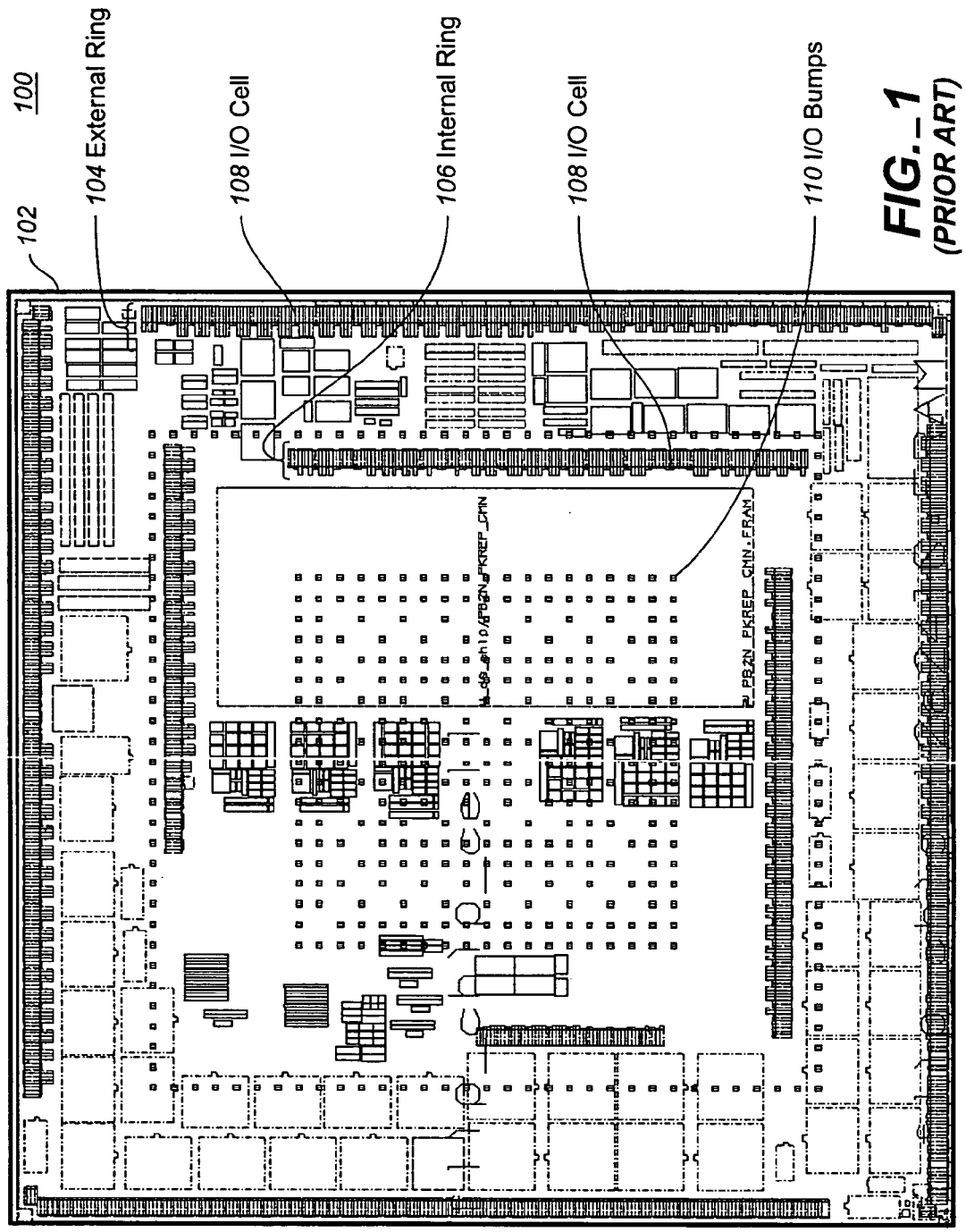
FIG. 1 illustrates a diagram of a typical integrated circuit chip architecture of the prior art.

FIG. 1 illustrates a diagram 100 of a typical integrated circuit chip architecture of the prior art. Shown in FIG. 1 are an integrated circuit chip 102, an external I/O ring 104, an internal I/O ring 106, I/O cells 108, and I/O bumps 110.

In FIG. 1, the I/O cells 108 are placed in the external I/O ring 104 and the internal I/O ring 106. The external I/O ring 104 has a rectangular shape that follows the outer edge of the chip 102. The internal I/O ring 106 has a structure generally identical to that of external I/O ring 104, however, the internal I/O ring 106 is typically located about halfway between the external I/O ring 104 and I/O bumps 110 in the center of the chip 102. To simplify the illustration, the power and ground buses in each of the external I/O ring 104 and the internal I/O ring 106 are not shown.

Figure 2:
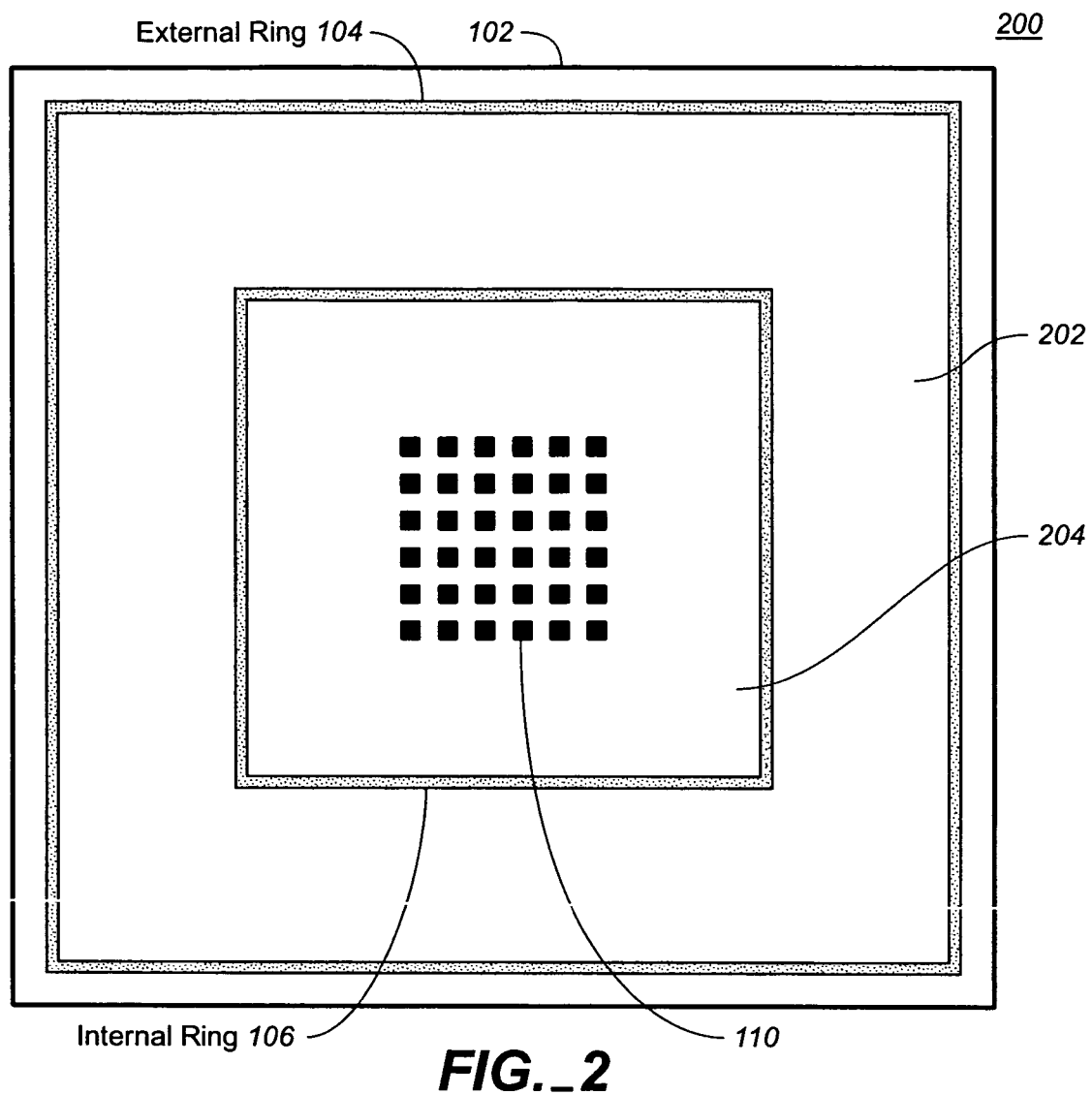
FIG. 2 illustrates a simplified diagram of the integrated circuit chip architecture of FIG. 1.

FIG. 2 illustrates a simplified diagram 200 of the integrated circuit chip architecture of FIG. 1. Shown in FIG. 2 are an integrated circuit chip 102, an external I/O ring 104, an internal I/O ring 106, I/O bumps 110, an external area 202, and an internal area 204.

In FIG. 2, the external area 202 is defined as the area bounded by the external I/O ring 104 and the internal I/O ring 106. The internal area 204 is defined as the area bounded by the internal I/O ring 106 and the outer edge of the I/O bumps 110 in the center of the chip 102. In previous methods used for generating a floorplan to define areas for placing cells for the modules used to implement the design, for example, of an application specific integrated circuit (ASIC), an area for each module is defined inside the union of the external area 202 and the internal area 204. A problem arises when a module area overlaps the internal I/O ring 106 as illustrated below.

Figure 3:
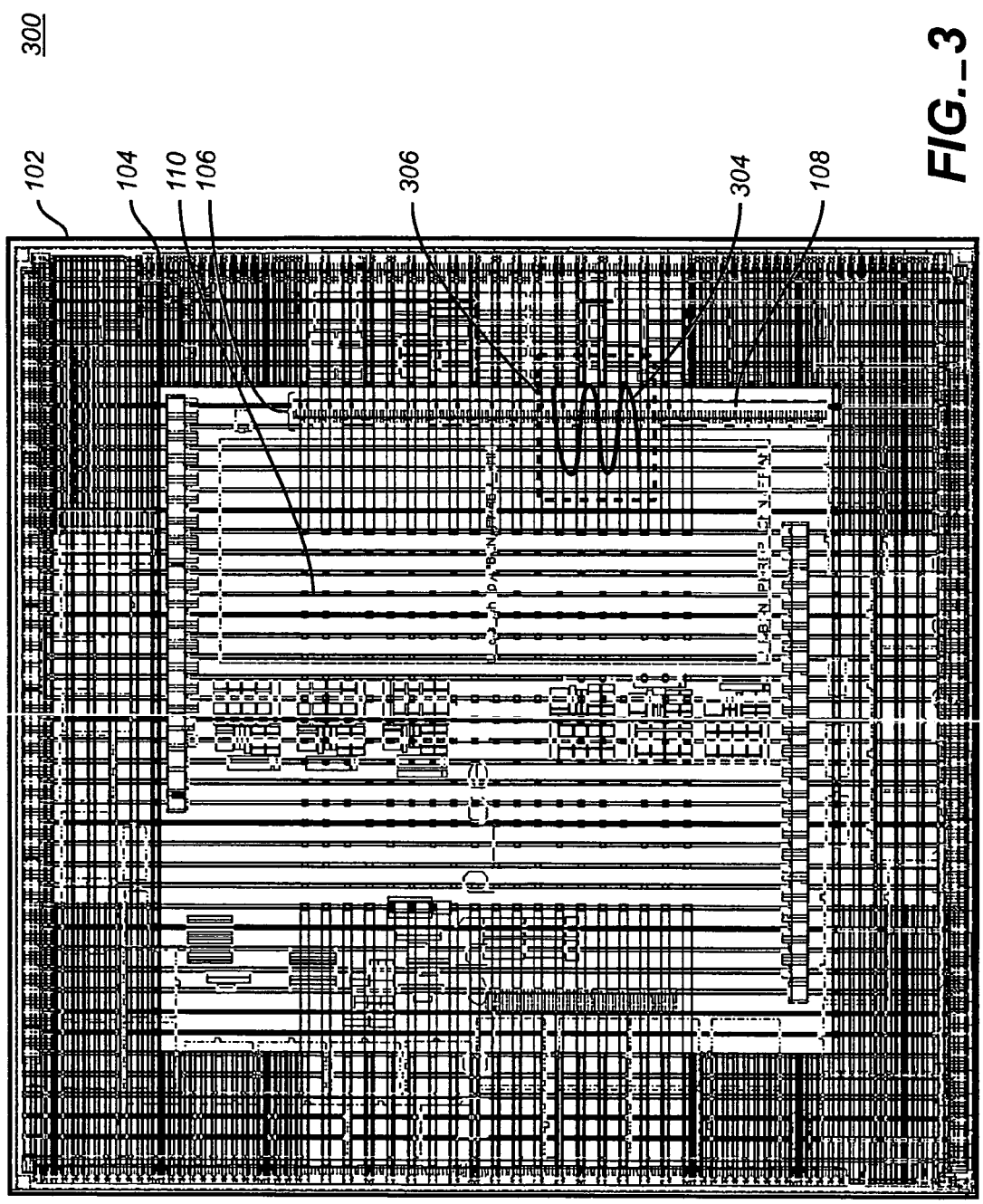
FIG. 3 illustrates a diagram of a module that overlaps the internal I/O ring in the integrated circuit chip architecture of FIG. 1.

FIG. 3 illustrates a diagram 300 of a module that overlaps the internal I/O ring 106 in the integrated circuit chip architecture of FIG. 1. Shown in FIG. 3 are an integrated circuit chip 102, an external I/O ring 104, an internal I/O ring 106, I/O cells 108, I/O bumps 110, module cells 302, cell paths 304, and a module 306 that overlaps the internal I/O ring 106.

In FIG. 3, typical floorplanning tools previously used to define an area on the chip 102 for the module 306 do not take into account the location of the module 306 relative to the internal I/O ring 106, so that the module 306 may overlap the internal I/O ring 106 by any amount. Because the space inside the internal I/O ring 106 is reserved for the I/O cells 108, the module cells 302 must be placed on either side of the internal I/O ring 106. As a result, typical cell placement tools will connect the module cells 302 in a zig-zag fashion across the internal I/O ring 104, disadvantageously increasing routing congestion, buffering requirements, and total interconnect length in the module 306. Generally, the more overlap between the module 306 and the internal I/O ring 104, the more routing congestion, additional buffering, and total interconnect length will result in the module 306.

Examples of previous solutions to the problem of routing congestion and increased total wire length are varying the size of the area on each side of the internal I/O ring 106 and restricting the location of the module 306. For example, functional blocks and other soft blocks in which module cells are placed and routed may be placed between the center of the chip and the internal I/O ring 106, while hard macros and core modules may be placed between the internal I/O ring 106 and the external I/O ring 104. However, these solutions may be overly restrictive, adversely affecting the quality of the final chip design.

The method of the present invention described below avoids the problems and disadvantages of previous floorplanning and cell placement methods described above.

Figure 4:
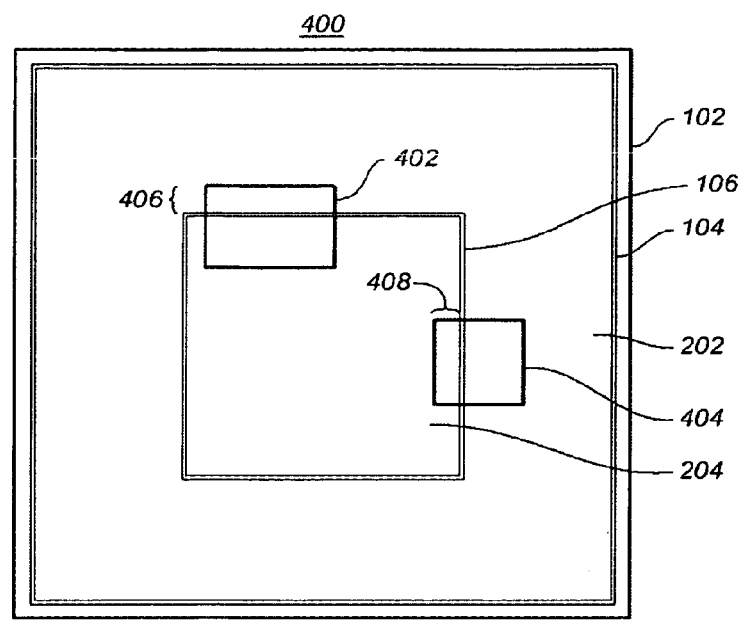
FIG. 4 illustrates a diagram of an area of least intersection according to an embodiment of the present invention.

FIG. 4 illustrates a diagram 400 of an area of least intersection according to an embodiment of the present invention. Shown in FIG. 4 are an integrated circuit chip 102, an external I/O ring 104, an internal I/O ring 106, an external area 202, an internal area 204, module areas 402 and 404, and areas of least intersection 406 and 408.

In FIG. 4, both module areas 402 and 404 overlap the internal I/O ring 106, however, the module area 402 has less overlap in the external area 202 bounded on the inside by the internal I/O ring 106 than in the internal area 204 bounded on the outside by the internal I/O ring 106. Accordingly, the module area 402 has an area of least intersection 406 that lies outside the internal I/O ring 106. Conversely, the module area 404 has less overlap in the internal area 204 than in the external area 202. Accordingly, the module area 404 has an area of least intersection 408 that lies inside the internal I/O ring 106. By minimizing the areas of least intersection 406 and 408, the routing congestion, additional buffering, and total interconnect length in module areas 402 and 404 will be advantageously minimized as well.

In a method of floorplanning and cell placement according to an embodiment of the present invention, for each module in the integrated circuit that overlaps the internal I/O ring 106, the area of intersection between the area defined for placing the module cells and the area bounded by the side of the internal I/O ring for which the area of intersection is least is summed for all the modules in the integrated circuit design. The positions of the modules in the floorplan are then adjusted until the area of least intersection of each module is a global minimum for all the module areas in the integrated circuit design. As a result, the routing congestion, buffering requirements, and total interconnect length are reduced for the floorplan of the method of the present invention compared to previous methods without restricting the location of module areas to either side of the internal I/O ring 106.

In other embodiments of the present invention, the routing congestion, buffering requirements, and total interconnect length may be further reduced as illustrated in FIGS. 5–14. In the example illustrated in FIGS. 5–14, only one overlapping module area is shown to simplify the illustration. The same procedure applies to every module area in the integrated circuit design that overlaps the internal I/O ring 106.

Figure 5:
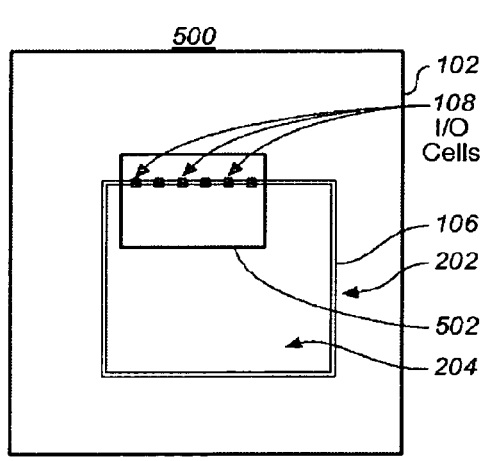
FIGS. 5 and 6 illustrate diagrams for a method according to an embodiment of the present invention of generating a floorplan in which the I/O cells are removed from a module that overlaps the internal I/O ring.
Figure 6:
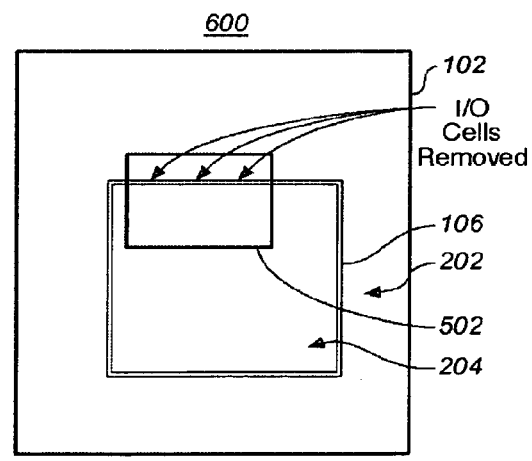

FIGS. 5 and 6 illustrate diagrams 500 and 600 of a method according to an embodiment of the present invention for generating a floorplan in which the I/O cells 108 are removed from a module area that overlaps the internal I/O ring. Shown in FIGS. 5 and 6 are an integrated circuit chip 102, an internal I/O ring 106, I/O cells 108, an external area 202, an internal area 204, and a module area 502.

In FIG. 5, the I/O cells are shown in the internal I/O ring 106 inside the module area 502. In FIG. 6, the I/O cells 108 have been removed. The removed I/O cells 108 are saved for future placement.

FIG. 7 illustrates a diagram 700 of a method according to an embodiment of the present invention for generating a floorplan that reserves a space in a module that overlaps the internal I/O ring for replacing the I/O cells removed in FIG. 6. Shown in FIG. 7 are an integrated circuit chip 102, an external I/O ring 104, an internal I/O ring 106, an external area 202, an internal area 204, a module area 502, an area of least intersection 702, and a reserved space 704.

In FIG. 7, the reserved space 704 is reserved by the floorplan inside the area of least intersection 702. In this example, the reserved space 704 follows the outer edge of the area of least intersection 702 and has a width equal to that of the I/O cells that were removed in FIG. 6.

A cell placement is then performed according to well known techniques from the floorplan of FIG. 7 with an additional objective of ensuring that each module cell that is placed on a side of the internal I/O ring 106 that includes the area of least intersection 702 lies within the area of least intersection 702 and outside the reserved space 704. An important feature of the present invention is that the cell placement does not have to avoid the I/O cells 108 in the internal I/O ring 106, because the I/O cells 108 have been removed.

FIG. 8 illustrates a diagram 800 of an example of a valid cell placement from the floorplan of FIG. 7. Shown in FIG. 8 are an integrated circuit chip 102, an internal I/O ring 106, an external area 202, an internal area 204, a module area 502, an area of least intersection 702, a reserved space 704, and module cells 802.

In FIG. 8, the module cells 802 placed on the side of the internal I/O ring 106 that includes the area of least intersection 702 are inside the module area 502 and outside the reserved space 704, therefore the cell placement is valid according to the new cell placement rule of the present invention.

FIG. 9 illustrates a diagram 900 of an example of a invalid cell placement from the floorplan of FIG. 7. Shown in FIG. 9 are an integrated circuit chip 102, an internal I/O ring 106, an external area 202, an internal area 204, a module area 502, an area of least intersection 702, a reserved space 704, and module cells 902.

In FIG. 9, the module cells 902 placed on the side of the internal I/O ring 106 that includes the area of least intersection 702 are inside the module area 502, however, some of the module cells 902 are placed inside the reserved space 704, which is a violation of the new cell placement rule of the present invention.

After performing the cell placement, the I/O cells that were removed in FIG. 6 are restored as illustrated in FIGS. 10–13.

FIGS. 10 and 11 illustrate diagrams 1000 and 1100 for a method according to an embodiment of the present invention of reshaping the internal I/O ring 106. Shown in FIGS. 10 and 11 are an integrated circuit chip 102, an external I/O ring 104, an internal I/O ring 106, an external area 202, an internal area 204, a module area 502, an area of least intersection 702, module cells 1002, and a modified internal I/O ring 1102.

In FIG. 10, the area of least intersection 702 is used to define a new shape for the internal I/O ring 106. In FIG. 11, the internal I/O ring 106 is reshaped to follow the outside edge of the area of least intersection 702 to become the modified internal I/O ring 1102, which also redefines the shape of the external area 202 and the internal area 204. In this example, the modified internal I/O ring 1102 follows the outside of the module area 502, however, if the area of least intersection 702 were inside the internal I/O ring 106, then the modified internal I/O ring 1102 would follow the inside of the module area 502.

FIGS. 12 and 13 illustrate diagrams 1200 and 1300 for a method according to an embodiment of the present invention of restoring the I/O cells removed in FIG. 6. Shown in FIGS. 12 and 13 are an integrated circuit chip 102, an external I/O ring 104, an internal I/O ring 106, I/O cells 108, an external area 202, an internal area 204, a reserved space 704, module cells 1002, and a modified internal I/O ring 1102.

In FIG. 12, the reserved space 704 is allocated to replace the I/O cells 108 that were removed in FIG. 6. In FIG. 13, the I/O cells 108 are replaced in the reserved space 704 in the modified internal I/O ring 1102.

FIGS. 14 and 15 illustrate diagrams 1400 and 1500 for a method according to an embodiment of the present invention of restoring the I/O cells 108 removed in FIG. 6 along the boundary of the module cells 1002. Shown in FIG. 14 are an integrated circuit chip 102, an external I/O ring 104, an internal I/O ring 106, I/O cells 108, an external area 202, an internal area 204, a reserved space 704, module cells 1002, and a modified internal I/O ring 1102.

In FIG. 14, the I/O cells 108 are replaced along the boundary of the module cells 1002 to further reduce interconnect length, which may be desirable in certain applications. The unused portion of the reserved space 704 may also be released to increase the density of cell placement, if desired, as shown in FIG. 15.

FIG. 16 illustrates a flow chart 1600 of a method according to an embodiment of the present invention for floorplanning and cell placement.

Step 1602 is the entry point of the flow chart 1600.

In step 1604, a design for an integrated circuit architecture that includes a plurality of modules and an internal I/O ring is received as input.

In step 1606, a floorplan is created to define an area for placing module cells for each module so that the area of least intersection for each module is a global minimum for the plurality of modules as described above with reference to FIG. 4.

In step 1608, the floorplan for the integrated circuit architecture is generated as output.

The following steps are optional steps to further improve the performance of the integrated circuit design.

In step 1610, the I/O cells inside the area of least intersection are removed.

In step 1612, a space is reserved inside the area of least intersection having a width sufficient for replacing the I/O cells removed in step 1610.

In step 1614, a cell placement is generated from the floorplan so that each module cell that is placed on a side of the internal I/O ring that includes the area of least intersection lies within the area of intersection and outside the reserved space.

In step 1616, the internal I/O ring is reshaped to conform to the reserved space as illustrated in FIG. 11.

In step 1618, the removed I/O cells are replaced, either in the reserved space as illustrated in FIG. 13 or on the boundary of the module cells inside the area of least intersection as illustrated in FIG. 14.

Step 1620 is the exit point of the flow chart 1600.

Advantages of the method of the present invention described above include minimizing congestion in the internal I/O ring and reducing overall interconnect length and delay. Also, the design flow is simplified, resulting in the removal of manual operations formerly required to correct internal I/O ring congestion, and unnecessary design restrictions are avoided.

Alternatively, the method of the present invention may be used to avoid congestion in any pre-placed cells that may present obstacles to module floorplanning and placement, simply by replacing the area represented by the internal I/O ring with the area of the preplaced cells.

The methods illustrated in the flowchart descriptions above may be embodied in a computer program product and implemented by a computer according to well known programming techniques.

In another aspect of the present invention, a computer program product includes a medium for embodying a computer program for input to a computer and a computer program embodied in the medium for causing the computer to perform steps of:
(a) receiving as input a design for an integrated circuit architecture that includes a plurality of modules and an internal I/O ring;
(b) creating a floorplan to define an area for placing module cells for each module in the plurality of modules wherein for each module that overlaps the internal I/O ring, an area of intersection between the area defined for placing the module cells and an area bounded by a side of the internal I/O ring for which the area of intersection is least is a global minimum for the plurality of modules; and
(c) generating as output the floorplan for the integrated circuit architecture.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A method comprising steps of:
   (a) receiving as input a design for an integrated circuit architecture that includes a plurality of modules and an internal I/O ring;
   (b) creating a floorplan to define an area for placing module cells for each module in the plurality of modules;
   (c) for each module in the plurality of modules that overlaps the internal I/O ring, reserving an area for placing I/O cells outside the internal I/O ring in an area of intersection between the area defined for placing the module cells and an area bounded by a side of the internal I/O ring for which the area of intersection is least; and
   (d) generating as output the floorplan for the integrated circuit architecture.

2. The method of claim 1 further comprising a step of removing I/O cells from the internal I/O ring that belong to the area of least intersection.

3. The method of claim 2 further comprising reserving sufficient space in the area of least intersection for placing the removed I/O cells.

4. The method of claim 3 further comprising a step of generating a cell placement from the floorplan so that each module cell that is placed on a side of the internal I/O ring that includes the area of least intersection lies outside the space reserved for placing the removed I/O cells.

5. The method of claim 4 further comprising a step of reshaping the internal I/O ring to follow the space reserved for placing the removed I/O cells.

6. The method of claim 5 further comprising a step of replacing the removed I/O cells in the space reserved for placing the removed I/O cells.

7. The method of claim 4 further comprising a step of replacing the removed I/O cells along an edge of the area of least intersection.

8. A computer program product comprising:
   a medium for embodying a computer program for input to a computer; and
   a computer program embodied in the medium for causing the computer to perform steps of:
   (a) receiving as input a design for an integrated circuit architecture that includes a plurality of modules and an internal I/O ring;
   (b) creating a floorplan to define an area for placing module cells for each module in the plurality of modules; (c) for each module in the plurality off modules that overlaps the internal I/O ring, reserving an area for placing I/O cells outside the internal I/O ring in an area of intersection between the area defined for placing the module cells and an area bounded by a side of the internal I/O ring for which the area of intersection is least; and
   (d) generating as output the floorplan for the integrated circuit architecture.

9. The computer program product of claim 8 further comprising a step of removing I/O cells from the internal I/O ring that lie inside the area of least intersection.

10. The computer program product of claim 9 further comprising reserving sufficient space in the area of least intersection for placing the removed I/O cells.

11. The computer program product of claim 10 further comprising a step of generating a cell placement from the floorplan so that each module cell that is placed on a side of the internal I/O ring that includes the area of least intersection lies outside the space reserved for placing the removed I/O cells.

12. The computer program product of claim 11 further comprising a step of reshaping the internal I/O ring to follow the space reserved for placing the removed I/O cells.

13. The computer program product of claim 12 further comprising a step of replacing the removed I/O cells in the space reserved for placing the removed I/O cells.

14. The computer program product of claim 11 further comprising a step of replacing the removed I/O cells along an edge of the area of least intersection.

* * * * *